US008509515B2

(12) United States Patent
Manabe

(10) Patent No.: US 8,509,515 B2
(45) Date of Patent: Aug. 13, 2013

(54) PAPER SHEET IDENTIFYING DEVICE AND PAPER SHEET IDENTIFYING METHOD

(75) Inventor: Kunihiro Manabe, Tokyo (JP)

(73) Assignee: Universal Entertainment Corporation, Tokyo (JP)

(*) Notice: Subject to any disclaimer, the term of this patent is extended or adjusted under 35 U.S.C. 154(b) by 375 days.

(21) Appl. No.: 12/865,816

(22) PCT Filed: Jan. 30, 2009

(86) PCT No.: PCT/JP2009/051599

§ 371 (c)(1),
(2), (4) Date: Aug. 2, 2010

(87) PCT Pub. No.: WO2009/096535

PCT Pub. Date: Aug. 6, 2009

(65) Prior Publication Data

US 2010/0322503 A1 Dec. 23, 2010

(30) Foreign Application Priority Data

Jan. 31, 2008 (JP) ................................ 2008-020514

(51) Int. Cl.

*G06K 9/00* (2006.01)
*G06K 9/40* (2006.01)
*G06F 11/00* (2006.01)
*H03M 13/00* (2006.01)

(52) U.S. Cl.

USPC ........... 382/135; 382/100; 382/275; 714/746; 714/747; 714/799; 714/819

(58) Field of Classification Search

USPC ........................................................ 382/135
See application file for complete search history.

(56) References Cited

U.S. PATENT DOCUMENTS

| | | | | |
|---|---|---|---|---|
| 4,764,976 | A * | 8/1988 | Kallin et al. | 382/321 |
| 4,841,374 | A * | 6/1989 | Kotani et al. | 382/237 |
| 2006/0251287 | A1* | 11/2006 | Tsurumaki et al. | 382/100 |
| 2008/0205769 | A1* | 8/2008 | Taguchi et al. | 382/209 |

FOREIGN PATENT DOCUMENTS

| | | | |
|---|---|---|---|
| GB | 2438494 A | * | 11/2007 |
| JP | 9 73573 | | 3/1997 |
| JP | 2005 322139 | | 11/2005 |
| JP | 2006 202075 | | 8/2006 |
| JP | 2006 285775 | | 10/2006 |

OTHER PUBLICATIONS

Lee et al., "A Watermarking Sequence Using Parities of Error Control Coding for Image Authentication and Correction", May 2000, IEEE Transactions on Consumer Electronics, vol. 46, iss. 2, p. 313-317.*

* cited by examiner

*Primary Examiner* — Stephen R Koziol
*Assistant Examiner* — Timothy Choi
(74) *Attorney, Agent, or Firm* — KMF Patent Services, PLLC; Kenneth M. Fagin, Esq.; Peter Konzel, Esq.

(57) ABSTRACT

A bill identification apparatus accurately identifying an authenticity with a folding line formed in a watermark. The bill identification apparatus includes: bill reading means; a converter which converts the watermarked image read by the bill reading means for each pixel containing color information having brightness; a image correction processing part which calculates an average density value for each pixel array in one direction, an average density value for each pixel array in the other direction, and an average density value of an entire watermarked image and corrects density values of respective pixels so as to approximate or match the average density value of the entire watermarked image; a reference data storage part which stores a reference watermarked image; an identification processing part which compares the corrected image by the image correction processing part with the reference watermarked image and identifies an authenticity.

10 Claims, 8 Drawing Sheets

| y \ x | 1 | 2 | 3 | 4 | 5 | 6 | 7 | | Average density value in horizontal line |
|---|---|---|---|---|---|---|---|---|---|
| 1 | 87 | 46 | 215 | 5 | 188 | 132 | 62 | → | 106 |
| 2 | 108 | 207 | 253 | 4 | 106 | 106 | 141 | → | 132 |
| 3 | 103 | 41 | 185 | 15 | 61 | 124 | 206 | → | 105 |
| 4 | 140 | 8 | 25 | 25 | 120 | 171 | 155 | → | 92 |
| 5 | 18 | 52 | 218 | 1 | 122 | 222 | 45 | → | 97 |
| 6 | 203 | 15 | 211 | 45 | 94 | 62 | 143 | → | 113 |
| 7 | 167 | 192 | 140 | 55 | 228 | 189 | 47 | → | 146 |
| 8 | 214 | 229 | 154 | 33 | 60 | 200 | 139 | → | 145 |
| 9 | 215 | 249 | 153 | 25 | 126 | 56 | 88 | → | 130 |
| 10 | 104 | 136 | 78 | 16 | 78 | 244 | 227 | → | 124 |
| 11 | 193 | 85 | 43 | 36 | 202 | 12 | 50 | → | 89 |
| 12 | 173 | 201 | 128 | 46 | 109 | 181 | 151 | → | 141 |
| | ↓ | ↓ | ↓ | ↓ | ↓ | ↓ | ↓ | | |
| Average density values in vertical line | 144 | 121 | 150 | 25 | 123 | 143 | 121 | | |

Density value : 0 (Black) ~ 255 (White)

| Average density value in whole watermark image area | 118 |
|---|---|

| | 1 | 2 | 3 | 4 | 5 | 6 | 7 | | Average density values in vertical line |
|---|---|---|---|---|---|---|---|---|---|
| 1 | 75 | 56 | 196 | 112 | 196 | 120 | 72 | → | 118 |
| 2 | 69 | 190 | 207 | 84 | 87 | 67 | 124 | → | 118 |
| 3 | 91 | 51 | 166 | 122 | 69 | 112 | 216 | → | 118 |
| 4 | 141 | 31 | 19 | 145 | 141 | 172 | 178 | → | 118 |
| 5 | 14 | 70 | 207 | 116 | 139 | 218 | 63 | → | 118 |
| 6 | 182 | 17 | 184 | 143 | 94 | 62 | 145 | → | 118 |
| 7 | 114 | 162 | 81 | 131 | 196 | 137 | 17 | → | 118 |
| 8 | 162 | 195 | 95 | 100 | 18 | 148 | 109 | → | 118 |
| 9 | 177 | 234 | 109 | 106 | 109 | 19 | 73 | → | 118 |
| 10 | 73 | 127 | 40 | 98 | 59 | 213 | 218 | → | 118 |
| 11 | 197 | 111 | 41 | 158 | 227 | 17 | 77 | → | 118 |
| 12 | 125 | 175 | 73 | 116 | 81 | 133 | 125 | → | 118 |
| | ↓ | ↓ | ↓ | ↓ | ↓ | ↓ | ↓ | | |
| | 118 | 118 | 118 | 118 | 118 | 118 | 118 | | |

Average density values in vertical line

Density value : 0 (Black) ~ 255 (White)

| | |
|---|---|
| Average density value in whole watermark image area | 118 |

PAPER SHEET IDENTIFYING DEVICE AND PAPER SHEET IDENTIFYING METHOD

FIELD OF THE INVENTION

The present invention relates to a paper sheet identifying apparatus (or device) which identifies the authenticity of a bill, a gift certificate, a coupon ticket, and so on (hereafter, collectively referred to as "paper sheet") and a paper sheet identifying method thereof.

BACKGROUND ART

In general, a bill processing apparatus, which processes a bill as one of the embodiments of a paper sheet or the like, is incorporated into a service device such as a game medium rental machine installed in a game hall, a vending machine or a ticket-vending machine installed in a public space, or the like which identifies the authenticity of a bill inserted from a bill insertion slot by a user and provides various types of products and services in accordance with a value of the bill having been judged as authentic.

Usually, the authenticity of the bill is identified by a bill identification apparatus installed in a bill traveling route provided so as to connect to a bill insertion slot. The bill moving inside the bill traveling route is irradiated with light, and a transmitted light or a reflected light therefrom is received by a light receiving sensor, and the received light data is compared with the legitimate data to identify the authenticity of the bill.

Meanwhile, various innovations have been devised for bills in order to prevent counterfeiting thereof. As one of those, a watermark with an uneven portrait is formed by a special technique, or a see-through patterned mark which can be determined as authentic or counterfeit with a tactile sense is formed (hereinafter, watermarks formed on bills or see-through patterning are collectively referred to as "watermark"). Such a watermark may be utilized as an authenticity identification object area in order to improve the identification accuracy of the authenticity of the bill. In Patent reference 1, for example, a bill discrimination device is disclosed, which discriminates the authenticity of the bill by irradiating infrared light and visible light to a watermark and acquiring transmitted light and reflected light therefrom.

Further, in Patent reference 1, a technology to improve the identification accuracy of the authenticity is disclosed, in which a presser part that presses a bill is installed in the apparatus in consideration of wrinkle existence on the bill being inserted into a bill insertion slot and the bill is pressed by the presser part to smooth the wrinkles out of the bill, whereby the identification accuracy of the authenticity may be improved.

[Patent reference 1] Japanese unexamined patent application publication No. 2006-285775

DISCLOSURE OF THE INVENTION

Problem to be Solved by the Invention

As described above, the identification accuracy of the authenticity of the bill is expected to be improved by utilizing a watermarked portion of the bill. However, a bill is usually folded in two so as to be often put into a wallet, and if a watermarked area coincides with this folding portion, the area is affected by the folding crease such that the identification accuracy of the authenticity may be lowered. In this case, as disclosed in the above-mentioned Patent reference 1, even if the bill is pressed by the presser part, such wrinkle (crease) may not be sufficiently removed.

A paper sheet identification apparatus which is capable of identifying the authenticity with high accuracy of the paper sheet even if the folding line (crease) or the like coincides with a water mark formed in the paper sheet is provided and a paper sheet identification method thereof is also provided.

Means to Solve the Problem

In the present invention, a paper sheet identification apparatus includes: reading means for reading a watermarked image formed on a paper sheet; a converter which converts the watermarked image read by the reading means into data for each pixel of a predetermined size as a unit, which contain color information having brightness; a watermarked image correction processing part which calculates an average density value for each pixel array in one direction, an average density value for each pixel array in the other direction, and an average density value of the entire watermarked image on the basis of the watermarked image having been converted for each pixel by the converter, and corrects the density values of the respective pixels such that the respective average density values may be approximated or matched to the average density value of the entire watermarked image; a storage part which stores a reference watermarked image serving as a standard for comparison and containing color information having brightness for each pixel in a predetermined size as a unit; an identification processing part which compares the image corrected by the watermarked image correction processing part with the reference watermarked image stored in the storage part and identifies the authenticity of the paper sheet. Further features of the present invention, its nature, and various advantages will be more apparent from the accompanying drawings and the following description of the preferred embodiment.

| Description Of Notations | |
|---|---|
| 1 | bill processing apparatus |
| 2 | apparatus main body |
| 3 | bill traveling route |
| 5 | bill insertion slot |
| 8 | bill reading means |
| 10 | skew correction mechanism |
| 80 | light emitting unit |
| 80a | first light emitting part |
| 81 | light receiving/emitting unit |
| 81a | light receiving part |
| 81b | second light emitting part |
| 200 | control means |

BEST MODE FOR CARRYING OUT THE INVENTION

Hereinafter, an embodiment of the present invention will be described with reference to the drawings.

Figure 1:
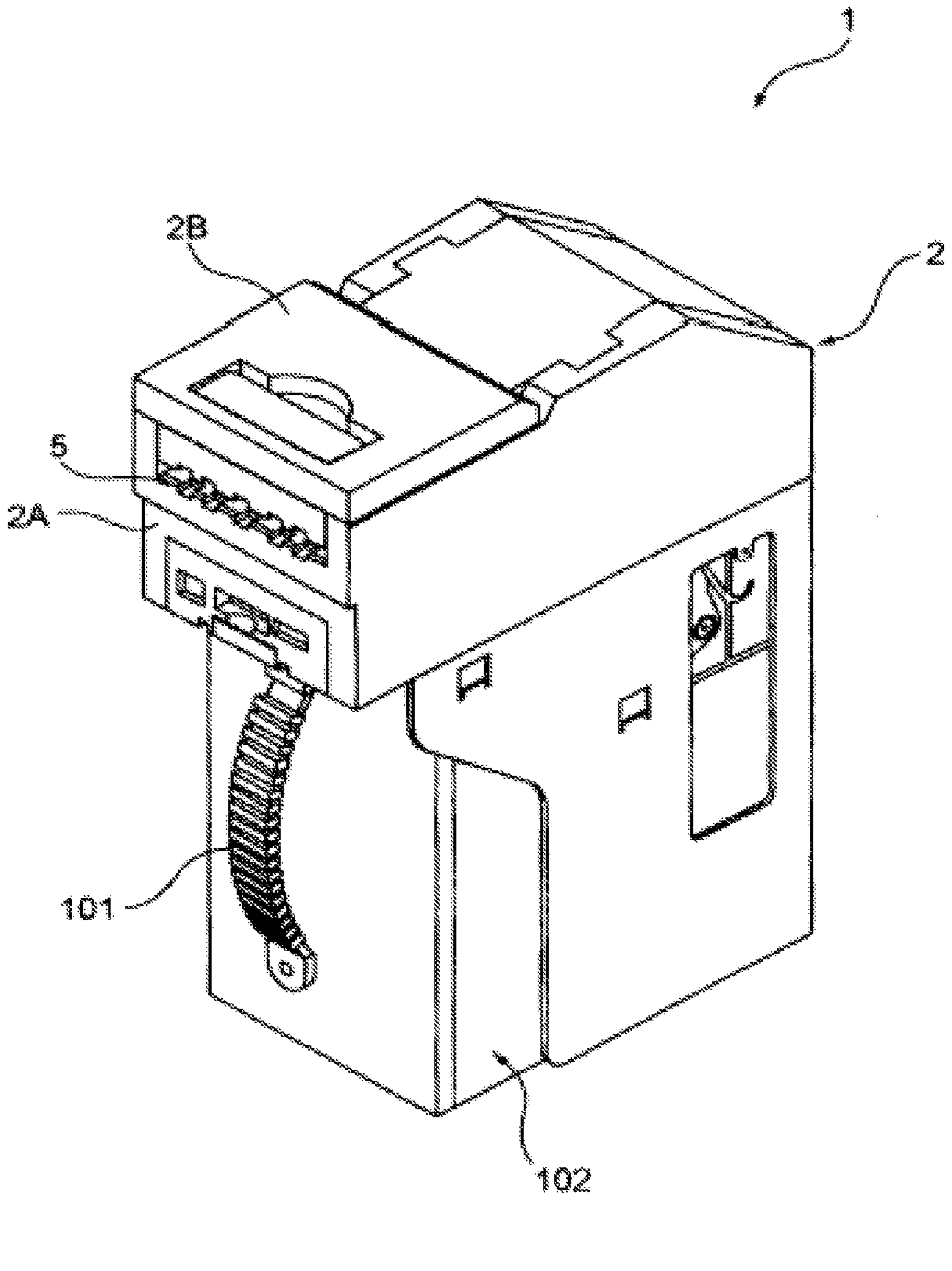
FIG. 1 is a perspective view showing an entire structure of an example of a paper sheet identification apparatus embodied from a paper sheet identification apparatus.
Figure 2:
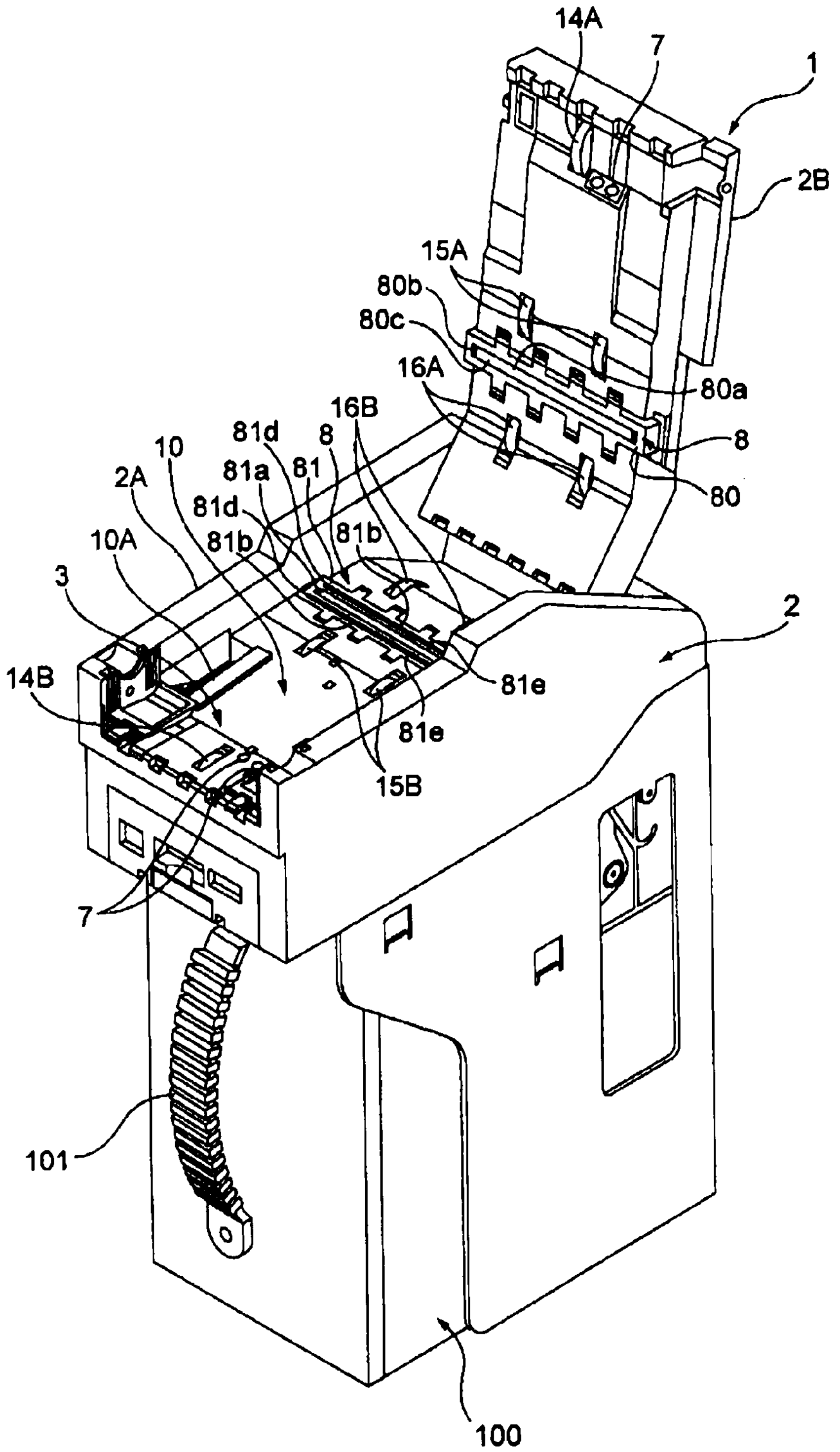
FIG. 2 is a perspective view showing the bill processing apparatus in a state that an open/close member is opened for a main body frame of an apparatus main body.
Figure 3:
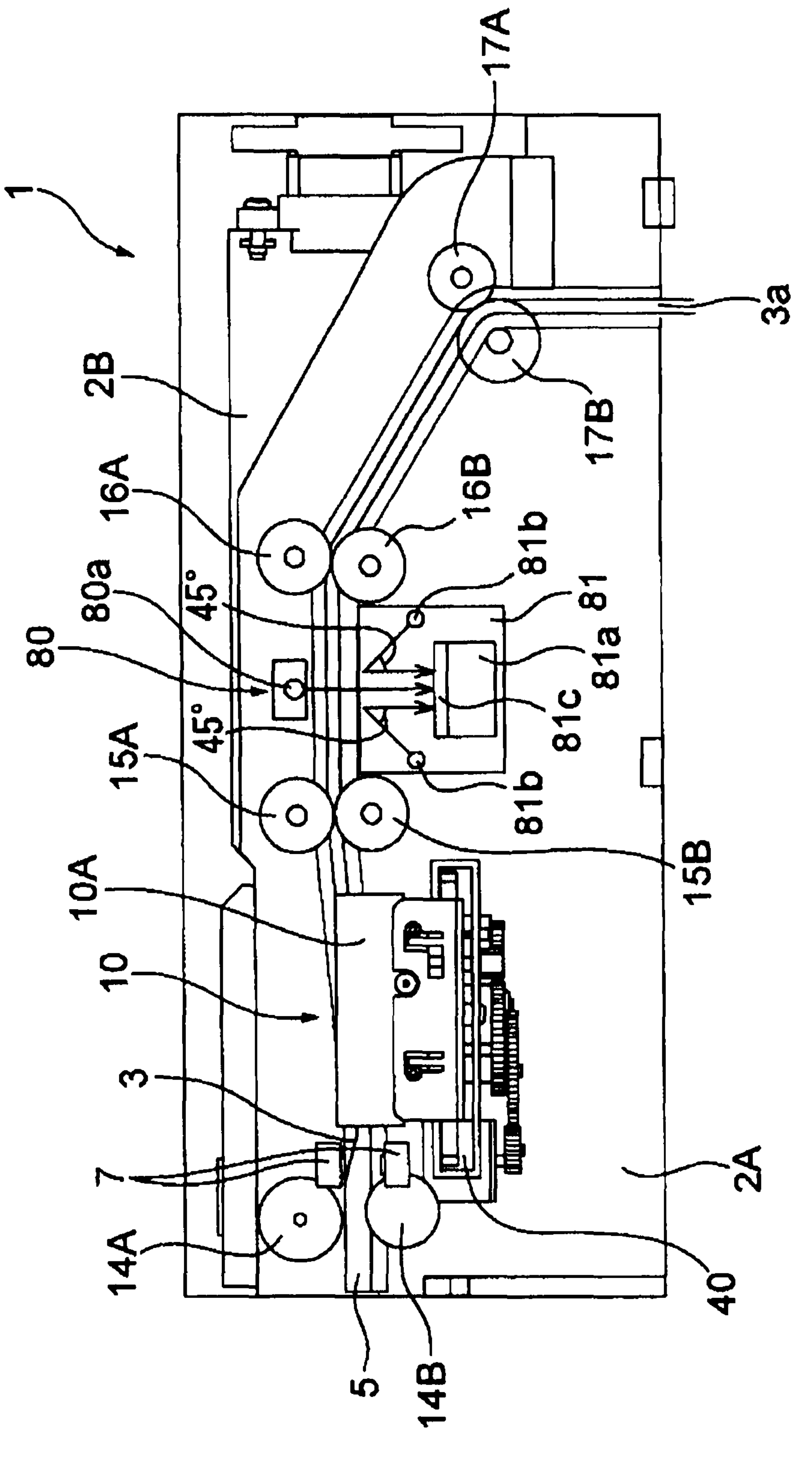
FIG. 3 is a right side view schematically showing a traveling route of a bill to be inserted from an insertion slot.

FIGS. 1 to 3 are diagrams showing an example where a paper sheet processing apparatus of the present invention is applied to a bill processing apparatus. FIG. 1 is a perspective view showing the entire structure; FIG. 2 is a perspective view showing a state that an open/close member is opened for a main body frame of an apparatus main body; and FIG. 3 is a right side view showing schematically a traveling route of a bill being inserted from an insertion slot.

A bill identification apparatus 1 of this embodiment is so configured that it can be incorporated into, for example, various types of gaming machines such as a slot machine and the like, and the bill processing apparatus 1 includes an apparatus main body 2 and a housing part (e.g., stacker or cashbox) 102 which is provided to the apparatus main body 2 and is capable of stacking and housing a great number of bills. Here, the housing part 102 may be mountable to and demountable from the apparatus main body 2, and it is possible, for example, to remove from the apparatus main body 2 by pulling a handle 101 provided on the front face thereof in a state that a lock mechanism (not shown) is unlocked.

As shown in FIG. 2, the apparatus main body 2 has a main frame body 2A and an open/close member 2B being configured to be opened and closed for the main body frame 2A by rotating around an axis positioned at one end thereof as a rotating center. Then, as shown in FIG. 3, the frame 2A and the open/close member 2B are configured to form a space (bill traveling route 3) through which a bill is conveyed such that both face each other across the space when the open/close member 2B is closed for the main body frame 2A, and to form a bill insertion slot 5 such that front exposed faces of both are aligned and that the bill traveling route 3 exits at the bill insertion slot 5. In addition, the bill insertion slot 5 is a slit-like opening from which a short side of a bill can be inserted into the inside of the apparatus main body 2.

Also, in the apparatus main body 2, a bill conveyance mechanism that conveys a bill along a bill traveling route 3; an insertion detecting sensor 7 that detects the bill inserted into the bill insertion slot 5; bill reading means 8 that is installed on a downstream side of the insertion detecting sensor 7 and reads out information on the bill in a traveling state; and a skew correction mechanism 10 that accurately positions and conveys the bill with respect to the bill reading means 8 are provided.

Hereafter, the respective components described above will be described in detail. The bill traveling route 3 extends from the bill insertion slot 5 toward the inside, and comprises a discharge slot 3*a* formed on the downstream side through which a bill is discharged into a bill housing part 100.

The bill conveyance mechanism is a mechanism capable of conveying the bill inserted from the bill insertion slot 5 along the insertion direction, and of conveying back the bill in an insertion state toward the bill insertion slot 5. The bill conveyance mechanism comprises a motor 13 (refer to FIG. 5) serving as a driving source installed in the apparatus main body 2; and conveyor roller pairs (14A and 14B), (15A and 15B), (16A and 16B), and (17A and 17B) which are installed at predetermined intervals along the bill traveling direction in the bill traveling route 3, and are driven to rotate by the motor 13.

The conveyor roller pairs are installed so as to be partially exposed on the bill traveling route 3, and all the pairs are constituted of driving rollers of the conveyor rollers 14B, 15B, 16B, and 17B installed on the underside of the bill traveling route 3 driven by the motor 13; and pinch-rollers of the conveyor rollers 14A, 15A, 16A, and 17A installed on the upperside and driven by the these driving rollers. In addition, the conveyor roller pair (14A and 14B) to first nip and hold therebetween the bill inserted from the bill insertion slot 5, and to convey the bill toward the back side, as shown in FIG. 2, is installed in one portion of the center position of the bill traveling route 3, and a couple of the conveyor roller pairs (15A and 15B), (16A and 16B), or (17A and 17B) being disposed in this order on the downstream side thereof are respectively installed in a couple of portions with a predetermined interval in the lateral direction of the bill traveling route 3.

Further, the conveyor roller pair (14A and 14B) disposed in the vicinity of the bill insertion slot 5 is usually in a state that the upper conveyor roller 14A is spaced from the lower conveyor roller 14B, and the upper conveyor roller 14A is driven to move toward the lower conveyor roller 14B to nip and hold the inserted bill therebetween when insertion of the bill is sensed by the insertion detecting sensor 7.

Further, the skew correction mechanism 10 comprises a pair of right and left movable pieces 10A (only one side is shown) such that the pair of right and left movable pieces 10A are moved to get closer with each other by driving a motor 40 for a skew driving mechanism, whereby the skew correction process is performed for the bill.

The insertion detecting sensor 7 is to generate a detection signal when a bill inserted into the bill insertion slot 5 is detected. And when the detection signal is generated, the above-mentioned motor 13 is driven in a normal direction and the bill is conveyed in the insertion direction. The insertion detecting sensor 7 of this embodiment is installed between the pair of conveyor rollers (14A and 14B) and the skew correction mechanism 10 and comprises, for example, an optical sensor such as a regressive reflection type photo sensor. However, the insertion detecting sensor 7 may comprise a mechanical sensor other than the optical sensor.

The bill reading means 8 reads bill information on the bill conveyed in a state that the skew is eliminated by the skew correction mechanism 10, and determines the validity (authenticity). In this embodiment, the bill reading means 8 is configured to comprise a line sensor which irradiates the bill being conveyed from top and bottom sides thereof with light such that transmitted light and reflected light thereof are detected by a light receiving element so as to perform reading.

An authenticity identification process in this embodiment is, in order to make an attempt to improve the identification accuracy, configured such that a printed portion of a bill to be conveyed is irradiated with light, transmitted light and reflected light therefrom are received, to identify whether or not a feature point in the printed portion (an area of the feature point serving as the identification object and a way of extracting the area are arbitrarily determined) is matched to that of the legitimate bill by utilizing the above-mentioned bill reading means 8.

Then, in the present invention, when such an authenticity identification process is executed, a watermarked portion formed on the bill is also designated as an identification object area in an authenticity judgment process, and as will be described later, an authenticity judgment is performed such that the bill information on the watermarked portion read by the bill reading means 8 is converted into a two-dimensional image. That is, since the watermarked portion is a characteristic portion serving as one of the means in order to prevent the bill from being counterfeited, it is possible to further improve the identification accuracy by acquiring a two-dimensional image of such a watermarked area and comparing the two-dimensional image with data on the watermarked portion of the legitimate bill.

Also, since the legitimate bill has some area from which different image data are acquired depending on the wavelengths of the lights (for example, visible light or infrared light) irradiated to the area, in this embodiment, a plurality of light sources, in consideration of this view point, irradiate different lights of different wavelengths (in this embodiment, a red light and an infrared light are irradiated) to the bill and a transmitted light therethrough and a reflected light thereon are detected such that the authenticity identification accuracy may be improved. That is, since the red light and the infrared light have different wavelengths, transmitted-light data and reflected-light data from a plurality of lights of different wavelengths may be utilized for the bill authenticity judgment whereby the judgment may use the nature that the transmittance of the transmitted light transmitted through the specific area and the reflectance of the reflected light reflected on the specific area in the legitimate bill are different from those of the counterfeit bill. Therefore, an attempt is made to further improve the bill authenticity identification accuracy by employing light sources where a plurality of wavelengths are available.

Here, a concrete bill authenticity identification method will not be written in detail since it is possible to acquire various kinds of received-light data (transmitted-light data and reflected-light data) depending on the wavelengths of the irradiated lights to the bill and the irradiated areas of the bill. However, for example, in a watermarked area of the bill, if an image on the area is viewed with lights of different wavelengths, the image appears greatly different depending on the lights. Therefore, it can be considered that the bill to become an identification object is identified as the legitimate bill or the counterfeit bill by setting this portion as the specified area, acquiring transmitted-light data and reflected-light data from the specified area, and comparing such data with legitimate data from the same specified area of the legitimate bill having been stored in advance in storage means (ROM). At this time, provided that specified areas are predetermined according to the kind of the bill, predetermined weighting may be applied to the transmitted-light data and the reflected-light data from this specified area, thereby enabling improvement of the authenticity identification accuracy.

Then, since the above-mentioned bill reading means 8 is, to be described later, configured to perform the lighting control of the light emitting part with a predetermined interval and to comprise the line sensor which detects the transmitted light and the reflected light as the bill passes through, it is possible to acquire the image data based on the plurality of pieces of pixel information in a predetermined size as a unit by the line sensor.

In this case, the image data acquired by the line sensor is converted into data containing color information having brightness for each pixel by a converter which will be described later. In addition, the color information of each pixel having brightness to be converted by the converter corresponds to a contrasting density value, i.e., a density value (luminance value), and a numerical value from 0 to 255 (0: black to 255: white) is allocated to each pixel, for example, as information of one byte according to its density value.

Therefore, in above-mentioned authenticity identification process, not limited to the watermarked portion formed on the bill, but a variety of area of the bill is extracted; the pixel information (density values) contained in the extracted area and the pixel information in the same area of the legitimate bill are used so as to be substituted into an appropriate correlating equation; and then a coefficient of correlation is obtained by carrying out an operation thereof, thereby enabling the authenticity identification judgment by the coefficient. Or, in addition to the above description, analog waveforms, for example, are generated from the transmitted-light data and the reflected-light data, and the respective shapes of those waveforms are compared with each other, thereby enabling the authenticity identification judgment by such comparison.

Here, the configuration of above-mentioned reading means 8 will be described in detail with reference to FIGS. 2 and 3.

The abovementioned bill reading means 8 has a light emitting unit 80 which is installed on the side of the open/close member 2B and provided with a first light emitting part 89*a* capable of irradiating the upper side of the bill to be conveyed with the infrared light and the red light, and a light receiving/emitting unit 81 which is installed on the side of the main body frame 2A.

The light receiving/emitting unit 81 has a light receiving part 81*a* which is provided with a light receiving sensor facing the first light emitting part 89*a* across the bill and second light receiving parts 81*b* which are installed adjacently on the both sides of the light receiving part 81*a* along the bill traveling direction and are capable of irradiating the object with the infrared light and the red light.

The first light emitting part 89*a* disposed to face the light receiving part 81*a* works as a light source for the transmissive light. This first light emitting part 89*a* is, as shown in FIG. 2, comprised of a rectangular bar-like body made of synthetic resin which emits the light guided through a light guiding body 80*c* provided inside from an LED element 89*b* fixed to one end of the bar-like body. The first light emitting part having such a configuration is linearly installed in parallel with the light receiving part 81*a* (light receiving sensor) so as to be capable of entirely and equally irradiating the entire range in the width direction of the traveling route of the bill to be conveyed although the configuration is simple.

The light receiving part 81*a* of the light receiving/emitting unit 81 is formed in a thin-walled plate shape having a band shape extending in a lateral direction of the bill traveling route 3 and having a width to an extent that the sensitivity of the light receiving sensor (not shown) provided in the light receiving part 81*a* is not affected. In addition, the light receiving sensor is configured as a so-called line sensor in which a plurality of CODs (Charge Coupled Devices) are provided linearly in the center in the thickness direction of the light receiving part 81*a*, and a GRIN lens array 81*c* is disposed linearly above these CCDs so as to collect the transmitted light and the reflected light. Therefore, it is possible to receive the transmitted light or the reflected light of the infrared light or the red light emitted from the first light emitting part 89*a* or the second light emitting parts 81*b* such that the bill serving as the object for authenticity judgment is irradiated with the infrared light or the red light, and generate contrasting density data according to its luminance (pixel data containing information of brightness) as the received-light data and a two-dimensional image on the basis of the contrasting density data.

The second light emitting part 89*b* of the light receiving/emitting unit 81 works as a light source for the reflection light. This second light emitting part 81*b* is, in a similar manner as the first emitting part 89*a*, comprised of a rectangular bar-like body made of synthetic resin which emits the light guided through a light guiding body 81*e* provided inside from an LED element 81*d* fixed to one end of the bar-like body. The second light emitting part 81*b* is also configured to be linearly installed in parallel with the light receiving part 81*a* (line sensor).

The second light emitting parts 81*b* are capable of irradiating the bill with the light at an elevation angle of 45 degrees, for example, and are so installed that the light receiving part 81*a* may receive the reflected light from the bill. In this case, the lights irradiated to the bill by the second light emitting parts 81*b* are to be made incident at 45 degrees onto the light receiving part 81*a*, but the incident angle is not limited to 45 degrees such that the arrangement may be re-arranged as appropriate as long as the lights are irradiated evenly without shading to the surface of the bill. Therefore, the arrangement of the second light emitting parts 81*b* and the light receiving part 81*a* may be appropriately changed in design in accordance with the structure of the bill processing apparatus. Further, the second light emitting parts 81*b* are disposed on the both sides of the light receiving part 81*a* so as to be disposed across it and irradiate the respective lights at respective incident angles of 45 degrees to the bill. This is because, in the case where the surface of the bill has scratches or folded wrinkles, and in the case where the light is irradiated only from one side to an uneven surface generated by these scratches or folded wrinkles, it is unavoidable to make some portions shaded to cause shadow in the uneven surface. Therefore, it is prevented that the shadow is made in the portion of the uneven surface by irradiating the bill with the lights from the both sides, whereby the image data to be acquired can have a higher degree of accuracy than that of the single side irradiation. However, the second light emitting part 81*b* may be installed only on one side to configure the apparatus.

In addition, the configuration, the arrangement, and the like of the light emitting unit 80 and the light receiving/emitting unit 81 as described above are not limited to those described in this embodiment, and may be modified as appropriate.

Figure 4:
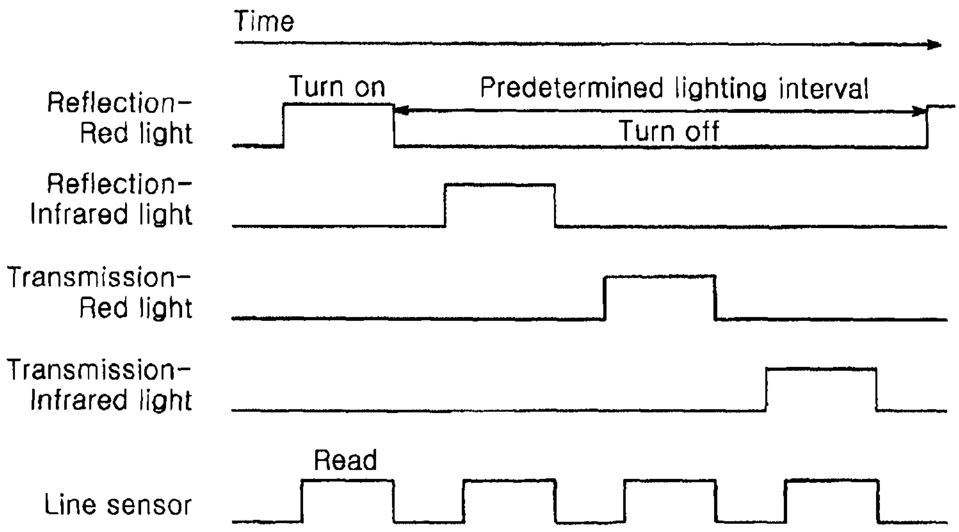
FIG. 4 shows a timing diagram illustrating lighting control of a light emitting part in bill reading means and lighting control of the light emitting part in reading out a bill.

Further, in the respective first light emitting part 89*a* and second light emitting part 81*b* in the above-described light emitting unit 80 and the light receiving/emitting unit 81, when the bill is read, as shown in a timing diagram of FIG. 4, an infrared light and a red light are controlled to be turned on and off with predetermined intervals. That is, lighting control is performed such that the four light sources constituted of the transmitting light sources of the red light and the infrared light and the reflecting light sources of the red light and the infrared light in the first light emitting part 89*a* and the second light emitting parts 81*b* repeatedly turn on and off the lights with a constant interval (predetermined lighting interval), and two or more of the light sources do not simultaneously turn on the lights without overlapping the on-phases of the respective light sources in any case. In other words, lighting control is performed such that, while any one light source is turned on, the other three light sources are turned off. Thereby, as described in this embodiment, it is possible even for the one light receiving part 81*a* to detect each light from each light source at a constant interval such that an image constituted of contrasting density data on a printed area of the bill can be read out by a transmitted light and a reflected light of the red light, and a transmitted light and a reflected light of the infrared light, and further it is possible to measure the printing lengths of both surfaces. In this case, it is also possible to improve the resolution by controlling the lighting interval to be shorter.

Then, the bill identified as legitimate by the bill reading means 8, which is configured as described above, is conveyed to the aforementioned bill housing part 100 via a discharge slot 3*a* of the bill traveling route 3 by the bill conveyance mechanism, and the bill is stacked and housed sequentially in the bill housing part. Further, the bill identified as counterfeit is returned toward the bill insertion slot 5 by driving the bill conveyance mechanism to reversely rotate, and the bill is discharged from the bill insertion slot 5.

Next, control means 200 that controls operations of the above-mentioned bill identification apparatus 1 will be described with reference to a block diagram of FIG. 5.

Figure 5:
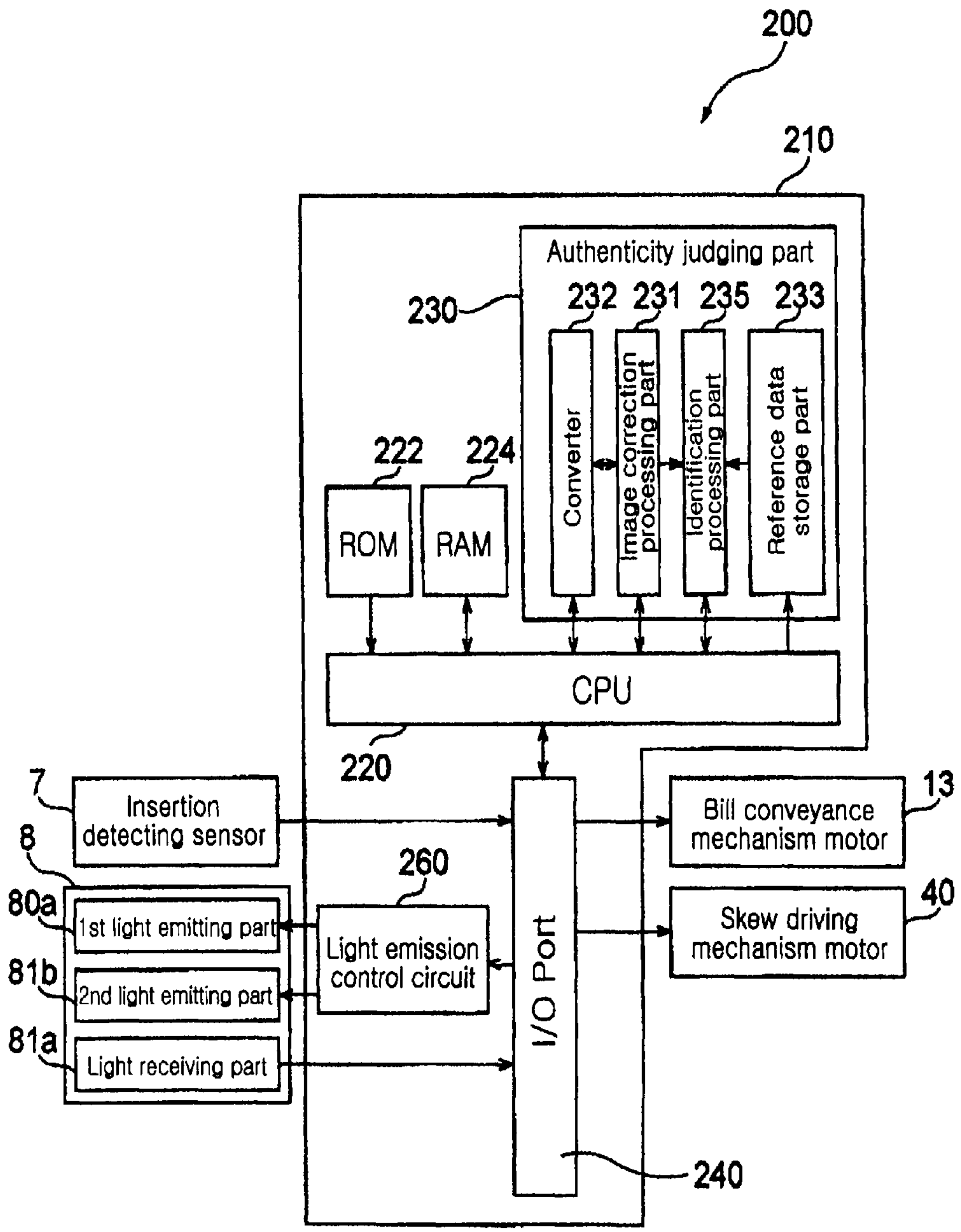
FIG. 5 is a block diagram showing a configuration of control means for controlling an operation of a bill processing apparatus.

The control means 200 as shown in a block diagram of FIG. 5 comprises a control board 210 which controls the operations of the above-described respective drive units, and a CPU (Central Processing Unit) 220 controlling driving of each drive unit and constituting the bill identification means, a ROM (Read Only Memory) 222, a RAM (Random Access Memory) 224, and an authenticity judging part 230 are implemented on the control board 210.

In the ROM 222, permanent data such as various types of programs such as an authenticity judgment program in the authenticity judging part 230, operation programs for the respective drive units such as the motor 13 for the bill conveyance mechanism and the motor 40 for the skew correction mechanism, and the like are stored.

The CPU 220 operates according to the programs stored in the ROM 222, and carries out input and output of the signals with respect to the respective drive units described above via an I/O port 240, so as to perform the entire operational control of the bill identification apparatus. That is, drive units such as the motor 13 for the bill conveyance mechanism, the motor 40 for the skew correction mechanism, and so on are connected to the CPU 220 via the I/O port 240, and the operations of these drive units are controlled by control signals transmitted from the CPU 220 in accordance with the operation programs stored in the ROM 222. Further, the CPU 220 is so configured that detection signals from the insertion detecting sensor 7 and a movable piece passage detecting sensor (not illustrated specifically) are input into the CPU 220 via the I/O port 240, and the driving of the above-mentioned respective drive units is controlled based on these detection signals.

Moreover, the CPU 220 is so configured that a detection signal based on a transmitted light and a reflected light of the light which is irradiated to the bill is input into the CPU 220 via the I/O port 240 from the light receiving part 81*a* in the bill reading means 8 as described above.

The RAM 224 temporarily stores data and programs used for the CPU 220 to operate, and also acquires and temporarily stores the received light data (image data constituted of a plurality of pixels) of the bill.

The authenticity judging part 230 has a function to carry out the authenticity identification process with respect to the bill to be conveyed so as to identify the authenticity of the bill. The authenticity judging part 230 has a converter 232 which converts the received light data of the bill stored in the RAM 224 into pixel information containing color information having brightness (density value) for each pixel, and an image correction processing part 231 which conducts a correction process of the color information of each pixel based on the pixel information converted by the converter 232.

Further, the authenticity judging part 230 has a reference data storage part 233 which stores the reference data with respect to the legitimate bill and a comparison judgment part 235 which compares comparison data, on which a correction process of the image with respect to the bill serving as the authenticity identification object is executed in the image correction processing part 231, with the reference data stored in the reference data storage part 233 such that the authenticity identification process is performed. In this case, the above-mentioned reference data storage part stores image data (reference image) of the legitimate bill being used in conducting the authenticity identification process with respect to the watermarked image in association with predetermined parameters (xStart, yStart, xsize, ysize).

In addition, the reference data (including the reference image) is stored in the dedicated reference data storage part 233. However, the data may be stored in the above-mentioned ROM 222. Further, the reference data which is referred to at the time of conducting the authenticity identification process may be stored in advance in the reference data storage part 233. However, the reference data storage part 233 may be so configured, for example, that the received-light data is acquired as a predetermined number of legitimate bills are conveyed by the bill conveyance mechanism, average values are calculated from the thus-obtained data of a great number of legitimate bills, and these average values are stored as the reference data in the reference data storage part 233.

Moreover, the CPU 220 is configured to be connected to the first light emitting part 89*a* and the second light emitting part 81*b* in the aforementioned bill reading means 8 via the I/O port 240. The first light emitting part 89*a* and the second light emitting parts 81*b* are controlled through a light emission control circuit 260 by a control signal from the CPU 220 in accordance with the operation programs stored in the abovementioned ROM 222 such that the lighting interval and the turning-off are controlled.

According to the bill reading means (line sensor) configured as described above, two-dimensional image information can be obtained from a great amount of pixel information. Then, for example, an object area is extracted on the occasion of conducting the authenticity identification on the basis of the brightness information of the respective pixels converted by the above-mentioned converter 232, and thus-extracted image information is compared with the reference data so as to conduct the authenticity identification. In this case, the area serving the authenticity identification object is preferably a portion where it is difficult to make a counterfeit. In the present invention, a two-dimensional image of the area of the watermarked portion of the bill is extracted, and the two-dimensional image is compared with the reference data whereby the authenticity identification process is performed.

Meanwhile, as described above, a watermarked portion of a bill is typically formed on the central area of the bill in many cases, and such a bill may be folded such that a folding line may be caused on the watermarked portion. In such a bill having the folding line, when a two-dimensional image is acquired by utilizing a line sensor as described above, the pixel information is subject to any changes along the folding line portion, which may cause difficulties in comparing the two-dimensional image with the reference data. As a factor to cause a change in pixel information along the folding line portion, it is considered that the light irradiated to the bill is deflected through the folding line portion such that the light receiving part 81*a* cannot detect all amount of the transmitted light in the case of acquiring the transmitted light by the light receiving part 81*a*, or it is also considered that the light irradiated to the bill is diffusely reflected on the folding line portion such that the light receiving part cannot detect all amount of the reflected light in a similar manner in the case of acquiring the reflected light by the light receiving part. As a result, even if a legitimate bill is actually inserted, the bill may be judged as counterfeit because the folding line is generated in the authenticity identification area.

In this embodiment, the effect of the folding line is alleviated even if the folding line is generated in the authenticity identification area (assuming it is a watermarked area) area has a folding line, the effect of the folding line is reduced.

Figure 6:
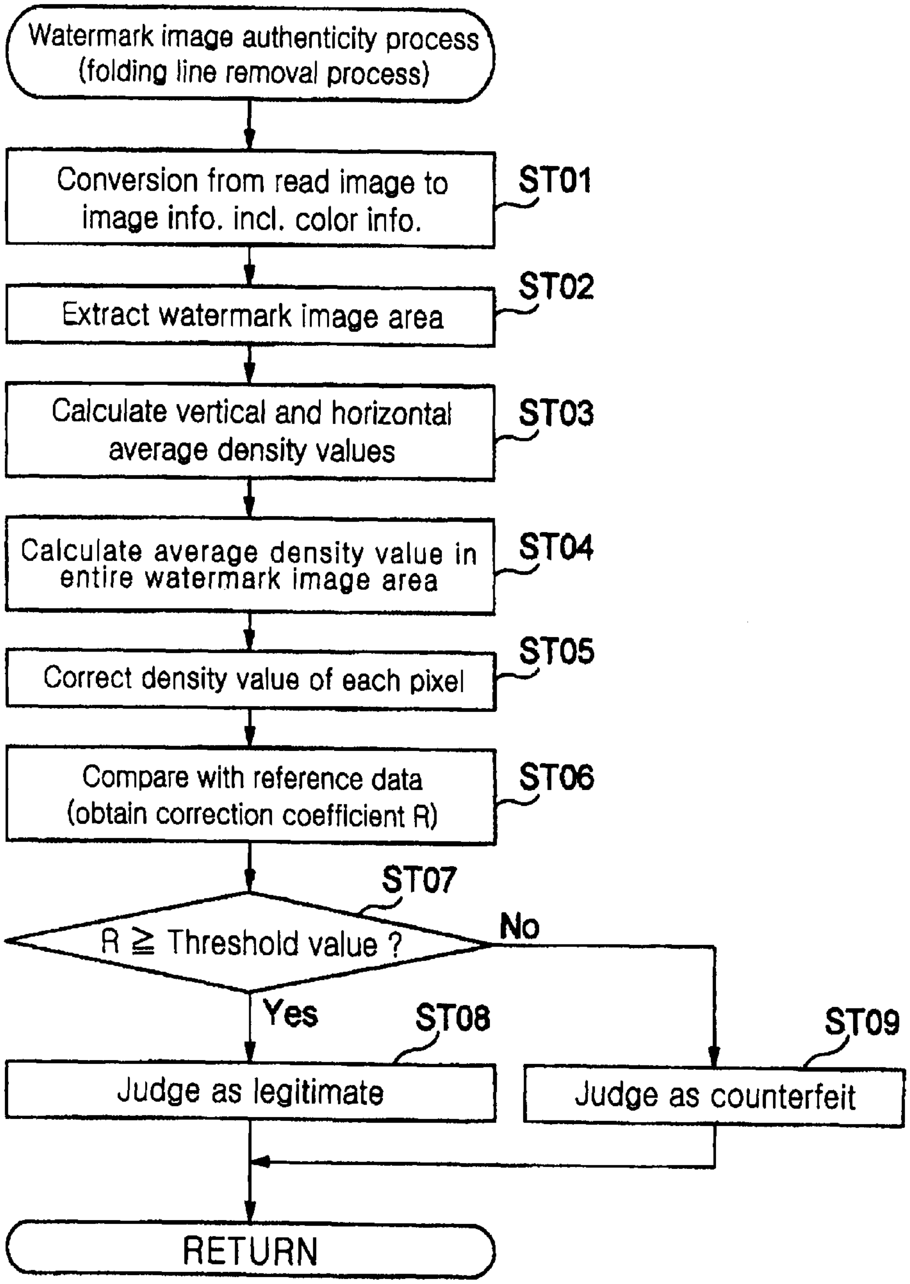
FIG. 6 shows a flowchart illustrating an authenticity identification processing operation of the bill.

Hereinafter, an example of a technique for the authenticity identification process based on a watermarked image including a folding line removal process will be described in detail with reference to a flowchart of FIG. 6 and diagrams of FIGS. 7A to 8B. In addition, such an authenticity identification process based on the watermarked image is executed as one of the bill authenticity identification including some other bill authenticity identification processes to be conducted than this embodiment.

First, the bill reading means 8 performs reading of a bill being conveyed, and a conversion process of the image into pixel information containing color information is performed by the converter 232 (ST01). As described above, the bill reading means 8 irradiates the bill conveyed by the bill conveyance mechanism with light (red light and infrared light) from the first light emitting part 89*a* and the second light emitting parts 81*b*, and receives transmitted light or reflected light therefrom with the light receiving part (line sensor) 81*a*, so as to execute the reading of the bill. It is possible to acquire many pieces of pixel information for a predetermined size of pixel as a unit per each irradiation light while the conveyance processing of the bill is conducted in the reading process, and the image data constituted of many pixels acquired in this way is stored in a RAM 224. And, here, the image data constituted of many pixels being stored is converted into color information having brightness (color information to which a numerical value from 0 to 255 (0: black to 255: white) corresponding to each density value is allocated) for each pixel by the converter 232.

Next, a process of extracting a watermarked image area is conducted from the pixel information being converted in this way (ST02). In this step, since the density value of the pixel information is increased (pixel is whitened) in a stage that the detected area is shifted from the printed area to the watermarked area as the bill is conveyed, for example, it is possible to extract the watermarked image area by setting a threshold value associated with such a change and a position thereof and detecting the position. It is, as a matter of course, possible to extract the watermarked image area by various methods on the basis of the acquired image information or the converted image information. Further, as irradiating light used for extracting the watermarked image, any one of red light and infrared light of transmitted light, and red light and infrared light of reflected light (or a combination thereof) among a plurality of light sources may be used.

Figures 7A, 7B:
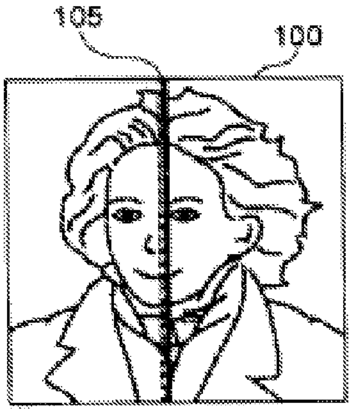
FIG. 7A is a diagram illustrating a configuration of the bill having a folding line.
FIG. 7B is a diagram illustrating arrays of pixels containing color information acquired from the bill having the folding line.

Assuming that, as shown in FIG. 7A, for example, a watermarked image area 100 of a bill to be conveyed includes a folding line 105 in a direction perpendicular to the traveling direction (or in the width direction to serve as a Y direction to be described later), as shown in FIG. 7B, in a great amount of pixel information in the watermarked image area containing color information converted by the converter 232, an area is generated in which density values thereof are relatively lowered compared to those aligned in a vertical direction in the other areas such that the area is located in a certain position and extends in a corresponding direction (it is the vertical direction and referred to as Y direction).

In addition, in FIG. 7B, to make the description simpler, it is assumed that a portion of 12 pixels is extracted in the Y direction of the watermarked image area 100, and a portion of 7 pixels is extracted in the traveling direction (i.e., the horizontal direction and referred to as X direction). Further, with respect to the pixel information corresponding to the folding line 105 of the bill as shown in FIG. 7A, a line along the vertical line at x=4 is illustrated as the generated line in which the density values are low (it is also considered surrounding positions such as lines at x=3 or 5 to be affected by the folding line) in FIG. 7B for the sake of better understanding. Further, the directions (one direction and the other direction) are made to correspond to the width direction and the length direction of the bill. However, the directions are not limited to such directions.

Next, a process of calculating average density values of the respective vertical lines (in the Y direction) and horizontal lines (in the X direction) of the great amount of pixel information (the watermarked image) in the watermarked image area 100 acquired in this way is performed (ST03). Here, given that a density value at the coordinate [x, y] of the watermarked image is f [x, y], and a lateral width is xsize and a vertical width thereof is ysize in each pixel, an average density value of the vertical lines and an average density value of the horizontal lines on the point of the coordinates [x, y] are derived by the following set of formulae (equation 1).

[Equation 1]

$$\overline{fy}[x] = \frac{\sum_j f[x, j]}{ysize}$$

$$\overline{fx}[y] = \frac{\sum_i f[i, y]}{xsize}$$

Then, subsequently, a process of calculating an average density value of the entire watermarked image area is performed (ST09). This average density value is derived by the following formula (equation 2).

[Equation 2]

$$\overline{f} = \frac{\sum_i \sum_j f[i, j]}{xsize \times ysize}$$

By the processes of calculating average density values as described above, with respect to the great amount of pixel information containing color information obtained by the converter 232, the average density values (144, 121, 150, . . . ) of the vertical lines, the average density values (105, 132, 105, . . . ) of the horizontal lines, and the average density value (118) of the entire watermarked image area are calculated.

Then, a correction process is performed with respect to the density values of the respective pixels in FIG. 7B (ST05). This is to perform a correction process such that the average density values of the vertical lines and the horizontal lines which are calculated as described above are matched to the average density value of the entire watermarked image area (118), and a corrected density value of each pixel at the point of the coordinates [x, y] is derived by the following formula (equation 3).

$$g[x,y]=f[x,y]+(\overline{f}-\overline{fy}[x])+(\overline{f}-\overline{fx}[y]) \quad \text{[Equation 3]}$$

Figures 8A, 8B:
FIG. 8A is a diagram illustrating a configuration of the bill corrected with respect to the folding line.
FIG. 8B is a diagram illustrating arrays of pixels containing color information, which are corrected such that the folding line may be eliminated.

In the above-mentioned formula 3, on the right-hand side, the second item bracket is a correction element for the longitudinal folding line, and the third item bracket is a correction element for the lateral folding line, and these correction elements are added to the average density values given that the density value of the original image is f [x, y], to remove the longitudinal and lateral folding lines. That is, by these correction processes, the correction process for the longitudinal and lateral pixel information is executed as shown in FIG. 8B. By such correction processes, as shown in FIG. 8A, it is possible to obtain a two-dimensional image from which the folding line is removed in the watermarked image area 100.

In addition, as the correction process, not an addition/subtraction as expression 3 described above, but a multiplication/division such as the following formula (equation 4) is used to be able to correct the density values of the respective pixels.

[Equation 4]

$$g[x, y] = f[x, y] \times \left(\frac{\overline{f}}{\overline{fy}[x]}\right) \times \left(\frac{\overline{f}}{\overline{fx}[y]}\right)$$

In the above-mentioned formula 4, on the right-hand side, the second item bracket is a correction element for the longitudinal folding line, and the third item bracket is a correction element for the lateral folding line, and it is possible to remove the longitudinal and lateral folding lines from the original image by multiplying each density value f [x, y] of the original image by this correction element.

By the correction processes for the respective pixels in ST05 described above, the effect by the linear folding line 105 shown in FIG. 7A is reduced, and additionally, the characteristics of the portrait in the watermarked image do not disappear in any case through the folding line removal process (ST01 to ST05).

Then, in the identification processing part 235, an image in the watermarked area is extracted by use of the above-mentioned parameters on the basis of the standard image stored in advance in the reference data storage part 233, and the amount of characteristics or the like of the image is compared with that of the two-dimensional image from which the folding line is removed by the above-mentioned correction processes, to identify whether or not the watermarked image is legitimate (ST06).

In addition, in a comparison process (ST06) carried out in the identification processing part 235 of this embodiment, a correlation coefficient R shown by the following formula (equation 5) is derived between the corrected image data as shown in FIG. 8B and the standard data stored in the reference data storage part 233, to identify the authenticity.

[Equation 5]

$$R = \frac{\sum_i \sum_j (g[i, j] - F)(s[i, j] - S)}{\sqrt{\sum_i \sum_j (g[i, j] - F)^2} \sqrt{\sum_i \sum_j (s[i, j] - S)^2}}$$

In the above-mentioned formula 5, [i, j] corresponds to the coordinate of the area on which the watermark of the bill is formed, and a density value of a two-dimensional image of the data acquired from the bill serving as an identification object of the bill coordinate [i, j] is set to f [i, j], a density value of the standard data is set to s [i, j], an average density of the acquired data is set to F, and an average density value of the standard data is set to S.

The correlation coefficient R derived by the above-mentioned formula 5 is, as known to the public, a value from −1 to +1, and if the R value is closer to +1 (correlation coefficient is higher), it is considered that the degree of similarity is higher. Therefore, a predetermined threshold value is set with respect to the correlation coefficient R to be derived, and when the correlation coefficient R is higher than or equal to the threshold value, it is judged as a legitimate bill (ST07; Yes, ST08), and when the correlation coefficient R is lower than the threshold value, it is judged as a counterfeit bill (ST07; Yes, ST09).

In this way, a correlation coefficient is derived from, not a partial area of a watermarked image to be acquired, but the entire watermarked image, to compare the authenticity, which makes it possible to more accurately identify the authenticity.

As described above, in the present embodiment, information on a watermarked image (two-dimensional image information) for preventing counterfeiting in the bill is acquired, and the information is compared with watermarked image information serving as a standard (a standard image), to be able to improve an accuracy of authenticity identification. Then, in such an authenticity identification method, even when the portion of the watermarked image has a folding line, it is possible to obtain an appropriate two-dimensional image from which the effect by the folding line is reduced by carrying out a folding line removal process as described above, which makes it possible to accurately execute the authenticity identification process. Further, the example in which the folding line is generated in the width direction has been shown. However, even in a case where a watermarked image area has a folding line along the traveling direction or becomes wrinkled, it is possible to perform the authenticity identification process by removing the folding line or the wrinkles by the technique as described above.

In addition, in the correction process in the above-mentioned image correction processing part 231, an average density value of each longitudinal pixel array, an average density value of each lateral pixel array, and an average density value of the entire watermarked image are calculated on the basis of a watermarked image converted for each pixel by the converter 232, and a correction process is performed such that the density values of the respective pixels are matched to the average density value of the entire watermarked image. However, there is no need for the density values of the respective pixels to be strictly matched to the average density value of the entire watermarked image. Even provided that a correction process is performed such that the density values of the respective pixels are approximated to the average density value of the entire watermarked image, it is possible to remove the effect by a folding line. Therefore, its approximate amount may be appropriately set depending to what extent the folding line is removed, and an accuracy of authenticity identification.

Further, in the above-described embodiment, with respect to the reference watermarked image (standard image) stored in the reference data storage part 233 as well, in the same way as the bill reading data to be acquired as an identification object, an average density value of each longitudinal pixel array, an average density value of each lateral pixel array, and an average density value of the entire watermarked image area may be calculated, and a correction process with respect to the density values of the respective pixels may be performed such that the density values of the respective pixels are approximated or matched to the average density value of the entire watermarked image area.

In this way, provided that a correction process which is the same as for the read watermarked image of the bill is performed with respect to the watermarked image serving as a standard as well, the association at the time of comparing the amounts of characteristics of the both is increased, which makes it possible to more accurately perform the authenticity identification.

Further, in the abovementioned configuration, a correlation coefficient is calculated from a density value for each pixel corrected by the watermarked image correction part and a density value for each pixel of the reference watermarked image stored in the reference data storage part 233 by the identification processing part 235, and it is judged whether the bill is the legitimate bill or a counterfeit bill on the basis of the correlation coefficient. However, various techniques may be used as an identification method. For example, a concrete method for identifying the authenticity may be appropriately modified such that amounts of variations in the respective pixels to be compared between image data subjected to a correction process and image data serving as a standard are calculated, to identify the authenticity on the basis of its average value, or the like.

As mentioned above, the embodiment of the present invention is described. However, the present invention is not limited to the above-described embodiment, and various modifications of the present invention can be implemented.

As described above, the present invention has a feature in the point that, after removing a folding line from image information on a watermarked portion of a bill serving as an identification object, the image information is compared with image information on a watermarked portion of a legitimate bill, to identify the authenticity of the bill, and the other configurations are not limited to those in the above-mentioned embodiment. Therefore, the technique as described above may be performed as one of the authenticity identification processes with various kinds of techniques and it may also be configured to include another authenticity identification process than this. In this case, the order of priority of executing the processes including other authenticity identification processes is not limited thereto.

Also, the configuration of the bill reading means 8 (which may be another configuration than the line sensor), and the mechanisms for driving the various types of driving members may be appropriately modified.

According to the above-mentioned paper sheet identification apparatus, information on a watermarked image for preventing counterfeiting in the bill is acquired, and the information is compared with watermarked image information serving as a standard, to be able to improve an accuracy of authenticity identification. In this case, when the portion of the watermarked image has a folding line, the image information on the folding line portion is different from that of the normal one, which is dark image information along the folding line. However, with respect to the watermarked image information (color information converted by the converter for each pixel) having been read by the above-mentioned reading means, it is possible to reduce the effect by the folding line by correcting the density values for the respective pixels such that the density values are approximated or matched to the average density value of the entire watermarked image. At this time, the characteristics of the watermarked image do not disappear by the correction process for removing the folding line described above. Therefore, by comparing the watermarked image with the reference watermarked image stored in advance in the storage part, it is possible to accurately identify the authenticity thereof even when the watermarked image has a folding line or the like.

Further, with respect to the reference watermarked image stored in the storage part, an average density value for each pixel array in one direction, an average density value for each pixel array in the other direction, and an average density value of the entire watermarked image may be calculated on the basis of the reference watermarked image, and a correction process with respect to the density values of the respective pixels may be performed such that the density values of the respective pixels are approximated or matched to the average density value of the entire watermarked image.

According to this configuration, since a correction process which is the same as for the read watermarked image of the paper sheet is performed with respect to the watermarked image serving as a standard as well, the association at the time of comparing the amounts of characteristics of the both is increased, which makes it possible to more accurately perform the authenticity identification.

Further, the identification processing part may calculate a correlation coefficient from a density value for each pixel corrected by the watermarked image correction part and a density value for each pixel of the reference watermarked image stored in the storage part, to judge the bill as the legitimate bill when the correlation coefficient is greater than or equal to a predetermined threshold value.

According to such a configuration, since the correlation coefficient is calculated from a density value for each pixel corrected by the watermarked image correction part and a density value for each pixel of the reference watermarked image stored in the storage part, it is possible to compare the authenticity of, not a partial area of the watermarked image, but the entire watermarked image, which makes it possible to more accurately identify the authenticity thereof. For example, it is possible to provide a paper sheet identification apparatus including a traveling route through which a paper sheet is carried in a predetermined carrying direction, a skew correction mechanism for performing a skew correction in the traveling direction of the paper sheet, a reading mechanism serving as bill reading means for reading a watermarked image formed on the paper sheet in a matrix form along the traveling direction and a direction perpendicular to the traveling direction, to convert the watermarked image into a plurality of pixel data respectively indicating brightness levels, a memory (for example, a RAM, a ROM, an FPROM, an HDD, or the like) serving as storage means for storing the pixel data read to be converted by the reading mechanism in association with the traveling direction and the perpendicular direction thereof, and a processor capable of carrying out an operation of the data stored by the memory. This processor is capable of calculating an average value of the entire pixel data to store it in the memory, and correcting the pixel data such that a traveling direction average value along the traveling direction of the pixel data and a perpendicular direction average value along the perpendicular direction of the pixel data are approximated or matched to the average value of the entire image data, to store the corrected pixel data in association with the traveling direction and the perpendicular direction into the memory. That is, the stored corrected pixel data is respectively associated with the positional data of the watermarked image of the bill. Accordingly, it is possible to perform an authenticity identification by comparing the corrected pixel data with the reference pixel data of the reference watermarked image stored in advance. To describe more specifically, the processor is capable of calculating a correlation coefficient from the corrected pixel data and the reference pixel data, to judge the bill as the legitimate bill when the correlation coefficient is greater than or equal to a predetermined threshold value.

Further, according to the above-described embodiment, a light receiving part which receives reflected light from a watermarked image formed on a paper sheet to be conveyed, a converter which converts the reflected light from the watermarked image received by the light receiving part into reflected light data having a brightness level for each pixel, a memory (for example a ROM, a RAM, an EEPROM, an HDD, or the like) which stores the converted reflected light data converted by the converter in association with the pixel position thereof, and a processor (for example, a CPU or the like) which carries out an operation may be included. This processor functions to be capable of calculating a correlation coefficient so as to correspond to the pixel position from the converted reflected light data for each pixel converted by the converter and the reference data for each pixel by the transmitted light from the watermarked image of the paper sheet serving as the reference. Further, since the processor also functions to be capable of judging whether or not the absolute value of the correlation coefficient is equal to or greater than the predetermined threshold value, it is possible to identify the authenticity of the watermarked image based on the judgment.

According to such a configuration, information on a watermarked image for preventing counterfeiting in the bill is acquired, and the information is compared with watermarked image information serving as a standard, to be able to improve an accuracy of authenticity identification. In this case, when the portion of the watermarked image has a folding line, the image information on the folding line portion is different from that of the normal one, which is dark image information along the folding line. However, with respect to the watermarked image information (color information for each pixel) having been obtained in the watermark image acquiring process, it is possible to reduce the effect by the folding line by correcting the density values for the respective pixels such that the density values are approximated or matched to the average density value of the entire watermarked image. At this time, the characteristics of the watermarked image do not disappear by the correction process for removing the folding line described above. Therefore, by comparing the watermarked image with the watermarked image as the reference, it is possible to accurately identify the authenticity thereof even if the watermarked image has a folding line or the like.

Further, with respect to the watermarked image as the reference, an average density value for each pixel array in one direction, an average density value for each pixel array in the other direction, and an average density value of the entire watermarked image may be calculated on the basis of the reference watermarked image, and a correction process with respect to the density values of the respective pixels may be performed such that the density values of the respective pixels are approximated or matched to the average density value of the entire watermarked image.

According to this configuration, since a correction process which is the same as for the read watermarked image of the paper sheet is performed with respect to the watermarked image serving as a standard as well, the association at the time of comparing the amounts of characteristics of the both is increased, which makes it possible to more accurately perform the authenticity identification.

Further, in the identification process, a correlation coefficient from a density value for each pixel corrected by the watermarked image correction part and a density value for each pixel of the reference watermarked image stored in the storage part, and it is possible to judge the bill as the legitimate bill when the correlation coefficient is greater than or equal to a predetermined threshold value.

According to such a configuration, since the correlation coefficient is calculated from a density value for each pixel corrected by the watermarked image correction process and a density value for each pixel of the reference watermarked image, it is possible to compare the authenticity of, not a partial area of the watermarked image, but the entire watermarked image, which makes it possible to more accurately identify the authenticity thereof.

As described above, a paper sheet identification apparatus which is capable of identifying the authenticity with high accuracy of the paper sheet even if the folding line (crease) or the like coincides with a water mark formed in the paper sheet can be provided and a paper sheet identification method thereof can also be provided.

The present invention can be incorporated into various types of apparatuses to identify the authenticity of the paper sheet other than the bill such as a gift certificate and coupon ticket, in addition to the above-mentioned bill.

What is claimed is:

1. A paper sheet identification apparatus comprising a reading unit which reads a watermarked image formed on a paper sheet;

a converter which converts the watermarked image read by the reading unit into data for each pixel of a predetermined size as a unit, which contain color information having brightness;

a watermarked image correction processing part which calculates an average density value for each pixel array in one direction, an average density value for each pixel array in another direction, and an average density value of an entire watermarked image based on the watermarked image having been converted for each pixel by the converter, and which corrects density values of respective pixels such that respective average density values for each pixel array in said one direction and for each pixel array in said another direction are approximated or matched to the average density value of the entire watermarked image;

a storage part which stores a reference watermarked image serving as a reference for comparison and containing color information having brightness for each pixel in the predetermined size as the unit; and an identification processing part which compares an image corrected by the watermarked image correction processing part with the reference watermarked image stored in the storage part and identifies an authenticity of the paper sheet.

2. The paper sheet identification apparatus according to claim 1, wherein the reference watermarked image stored in the storage part is subject to a correction process of density values of respective pixels such that an average density value for each pixel array in the one direction, an average density value for each pixel array in the other direction, and an average density value of the entire watermarked image are calculated based on the reference watermarked image so as to be approximated or matched to an average density value of the entire reference watermarked image.

3. The paper sheet identification apparatus according to claim 1, wherein the identification processing part calculates a correlation coefficient from a density value for each pixel, which is corrected by the watermarked image correction processing part, and a density value for each pixel of the reference watermarked image stored in the storage part, and judges the paper sheet as legitimate when the correlation coefficient is equal to or greater than a predetermined threshold.

4. A paper sheet identification method comprising:

a watermarked image acquiring step of acquiring a watermarked image formed on a paper sheet for each pixel of a predetermined size as a unit, which contains color information having brightness, a watermarked image correction processing step of calculating an average density value for each pixel array in one direction, an average density value for each pixel array in another direction, and an average density value of an entire watermarked image based on the watermarked image acquired for each pixel, and of correcting density values of respective pixels such that corrected average density values of the respective pixel arrays in said one direction and in said another direction are approximated or matched to the average density value of the entire watermarked image, and an identification processing step of comparing the corrected watermarked image with a watermarked image serving as a reference and identifying an authenticity thereof.

5. The paper sheet identification method according to claim 4, wherein the watermarked image serving as the reference is subject to a correction process of a density value for each pixel such that an average density value for each pixel array in the one direction, an average density value for each pixel array in the other direction, and an average density value of the entire watermarked image are calculated based on the reference watermarked image, and that density values of respective pixels are subject to the correction process so that corrected average density values of the respective pixel arrays are approximated or matched to the average density value of the entire watermarked image.

6. The paper sheet identification method according to claim 4, wherein a correlation coefficient is calculated from density values of respective pixels corrected in the watermarked image correction processing step and density values of respective pixels of the reference watermarked image and the paper sheet is judged as legitimate when the correlation coefficient is equal to or greater than a predetermined threshold in the identification processing step.

7. A paper sheet identification apparatus comprising:

a traveling route through which a paper sheet is conveyed in a predetermined traveling direction;

a skew correction mechanism which conducts a skew correction of the paper sheet to the traveling direction;

a reading mechanism which reads a watermarked image formed on the paper sheet in the traveling direction and in a traverse direction to the traveling direction in a matrix manner and converts the watermarked image into pixel data indicating a plurality of brightness levels;

a memory which stores the pixel data read and converted by the reading mechanism in association with the traveling direction and a traverse direction thereto; and a processor which is operable to operate on data stored by the memory, wherein the processor is operable to:

calculate an average value of all pixel data and let the memory store the average value;

correct the pixel data such that average values of pixel data for pixel arrays extending in the traveling direction and average values of pixel data for pixel arrays extending in the traverse direction are approximated or matched to an average value of the all pixel data and let the memory store the corrected pixel data in association with the traveling direction and the traverse direction; and compare the corrected pixel data with reference pixel data of a reference watermarked image having been stored in advance.

8. The paper sheet identification apparatus according to claim 7, wherein the processor is operable to:

calculate a correlation coefficient from the corrected pixel data and the reference pixel data; and judge the paper sheet as legitimate when the correlation coefficient is equal to or greater than a predetermined threshold value.

9. The paper sheet identification apparatus according to claim 2, wherein the identification processing part calculates a correlation coefficient from a density value for each pixel, which is corrected by the watermarked image correction processing part, and a density value for each pixel of the reference watermarked image stored in the storage part, and judges the paper sheet as legitimate when the correlation coefficient is equal to or greater than a predetermined threshold.

10. The paper sheet identification method according to claim 5, wherein a correlation coefficient is calculated from density values of respective pixels corrected in the watermarked image correction processing step and density values of respective pixels of the reference watermarked image and the paper sheet is judged as legitimate when the correlation coefficient is equal to or greater than a predetermined threshold in the identification processing step.

* * * * *